United States Patent
Sooriakumar et al.

(10) Patent No.: US 11,239,408 B2
(45) Date of Patent: Feb. 1, 2022

(54) ACOUSTIC TRANSDUCER AND RELATED FABRICATION AND PACKAGING TECHNIQUES

(71) Applicant: Kathirgamasundaram Sooriakumar, Singapore (SG)

(72) Inventors: Kathirgamasundaram Sooriakumar, Rochester, NY (US); Anu Austin, Lengkiong Tiga (SG); Ian Rose Bihag, Cebu (PH)

(73) Assignee: Sooriakumar Kathirgamasundaram, Singapore (SG)

( * ) Notice: Subject to any disclaimer, the term of this patent is extended or adjusted under 35 U.S.C. 154(b) by 11 days.

(21) Appl. No.: 16/560,510

(22) Filed: Sep. 4, 2019

(65) Prior Publication Data

US 2020/0075839 A1    Mar. 5, 2020

Related U.S. Application Data

(60) Provisional application No. 62/726,786, filed on Sep. 4, 2018.

(51) Int. Cl.
  *H01L 41/09*        (2006.01)
  *H01L 41/332*       (2013.01)
  (Continued)

(52) U.S. Cl.
  CPC .......... *H01L 41/0973* (2013.01); *H01L 25/16* (2013.01); *H01L 41/042* (2013.01); *H01L 41/0475* (2013.01); *H01L 41/053* (2013.01); *H01L 41/0933* (2013.01); *H01L 41/23* (2013.01); *H01L 41/332* (2013.01); *H04R 7/10* (2013.01); *H04R 7/18* (2013.01);
  (Continued)

(58) Field of Classification Search
  CPC combination set(s) only.
  See application file for complete search history.

(56) References Cited

U.S. PATENT DOCUMENTS 5,767,612 A * 6/1998 Takeuchi ............ H01L 41/0973
                                                      310/324
5,838,805 A   11/1998 Warnaka et al.
(Continued)

FOREIGN PATENT DOCUMENTS

CN         204598304 U        8/2015

OTHER PUBLICATIONS

International Search Report and Written Opinion dated Dec. 23, 2019. Distributed by Blaine R. Copenheaver Authorized Officer of the ISA/US.

(Continued)

*Primary Examiner* — Angelica M McKinney
(74) *Attorney, Agent, or Firm* — Cozen O'Connor

(57) ABSTRACT

An acoustic transducer includes a first flexible structure having a top surface and a bottom surface. A transducer is attached to the top surface of the first flexible structure, wherein the transducer causes deformation of the first flexible structure when an input electrical signal is applied to the transducer. A second flexible structure has a convex top surface and a concave bottom surface. The convex top surface of the second flexible structure is in contact with the bottom surface of the first flexible structure. Deformation of the first flexible structure causes deformation of the second flexible structure.

16 Claims, 12 Drawing Sheets

(51) Int. Cl.
*H01L 41/23* (2013.01)
*H01L 41/053* (2006.01)
*H01L 25/16* (2006.01)
*H01L 41/04* (2006.01)
*H04R 7/10* (2006.01)
*H04R 7/18* (2006.01)
*H04R 31/00* (2006.01)
*H04R 19/02* (2006.01)
*H01L 41/047* (2006.01)

(52) U.S. Cl.
CPC ........... *H04R 19/02* (2013.01); *H04R 31/003* (2013.01); *H04R 2201/003* (2013.01)

(56) References Cited

U.S. PATENT DOCUMENTS

| | | | |
|---|---|---|---|
| 6,857,501 B1 | 2/2005 | Han et al. | |
| 7,568,394 B1* | 8/2009 | Keilman | A61B 5/0215 361/283.4 |
| 8,339,798 B2* | 12/2012 | Minoo | H05K 1/115 361/764 |
| 2003/0214556 A1* | 11/2003 | Cabal | B41J 2/14 347/44 |
| 2009/0271964 A1 | 11/2009 | Nihei | |
| 2014/0270271 A1 | 9/2014 | Dehe et al. | |
| 2016/0345105 A1* | 11/2016 | Sooriakumar | H04R 31/003 |
| 2019/0047848 A1* | 2/2019 | Hoekstra | B81C 1/00158 |

OTHER PUBLICATIONS

First Examination Notice (with English Translation) from corresponding Chinese Application No. 201980002384.1, dated Oct. 27, 2020, 14 pages.

* cited by examiner

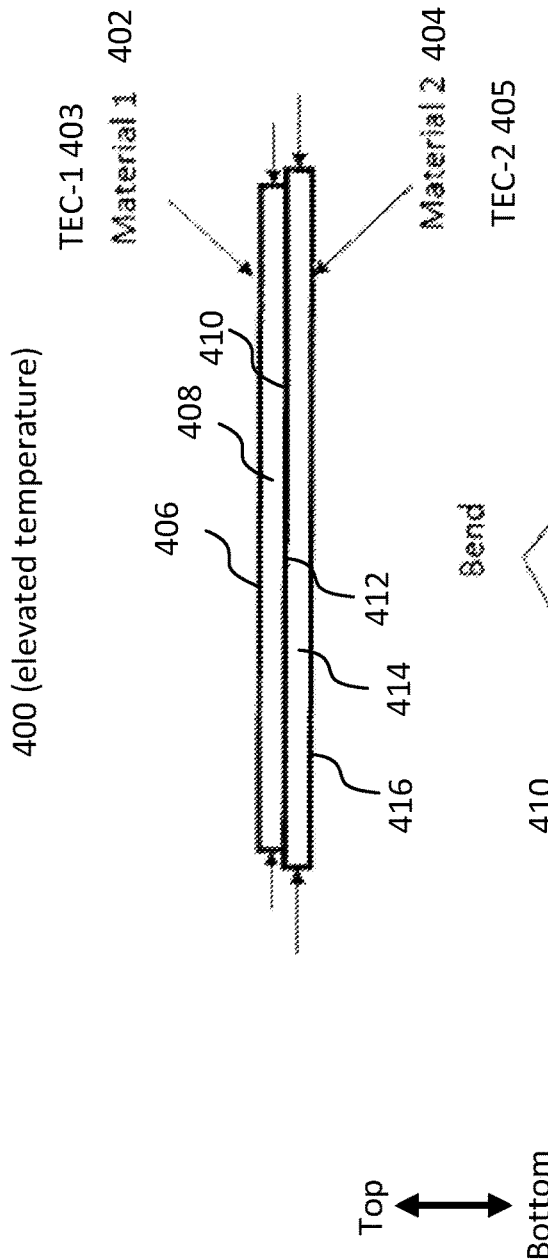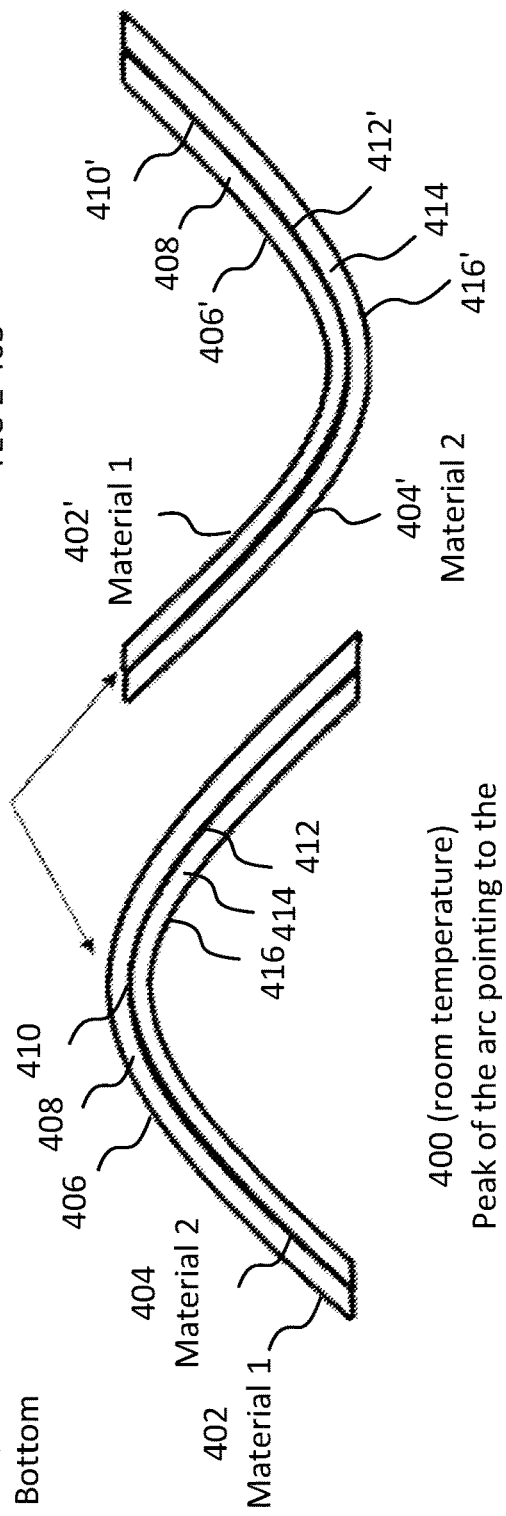

ACOUSTIC TRANSDUCER AND RELATED FABRICATION AND PACKAGING TECHNIQUES

CROSS-REFERENCE TO RELATED APPLICATIONS

This application is a U.S. non-provisional application which claims the benefit of U.S. Provisional Application No. 62/726,786, filed Sep. 4, 2018, which is hereby incorporated by reference in its entirety.

FIELD OF THE DISCLOSURE

The present disclosure relates generally to design, fabrication, and packaging techniques for acoustic transducer. More specifically, the disclosure relates to Micro Electro Mechanical System (MEMS) sound transmitter configured to push an amount of air which produces high quality of sound.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, is neither expressly nor impliedly admitted as prior art against the present disclosure.

Since the inception of semiconductor technology, the miniaturization of devices took place rapidly, in which handheld communication devices are still the front runners. Current semiconductor technology allows employment of surface mount assembly packaging technology. Various electronic components can thus be assembled in mass scale via automated assembly processes. However, there are still electronic components within these devices that are relatively large and require hand assembly. The hand-assembled components are usually made with conventional technology instead of the semiconductor technology. Among these components is an acoustic transducer, e.g., a speaker or a microphone.

SUMMARY

One of the critical values of a mobile communication device lies in the sound quality. The sound quality is governed by two elements, an acoustic transducer for "listening" and an acoustic transducer for "transmitting." The listening acoustic transducer is commonly referred to as a microphone and the transmitting acoustic transducer is commonly referred to as a speaker. Specifically, speaker components are still being manufactured using conventional technology and thus have inherent limitations in automated assembly. Reliability of such manually assembled speaker can be reduced because of human errors. To date, applicant is not aware of any commercialized product of semiconductor speaker or Micro Electro Mechanical System (MEMS) speaker.

The embodiments disclosed herein provide designs, fabrication, and packaging techniques of semiconductor speakers and/or Micro Electro Mechanical System (MEMS) speakers that provide high quality of sounds and can be made with standard semiconductor manufacturing processes.

To date, the applicant is not aware of any commercialized semiconductor speaker or Micro Electro Mechanical System (MEMS) speaker. The operation of a speaker requires moving a volume of air. The ability to move larger volumes of air leads to a higher sound quality. The embodiments disclosed herein provide designs, fabrication, and packaging techniques of semiconductor speakers and/or Micro Electro Mechanical System (MEMS) speakers that provide high quality sounds and can be made with standard semiconductor manufacturing processes.

Aspects of the disclosure provide an acoustic transducer. The acoustic transducer can function as a speaker. In one embodiment, the acoustic transducer includes a first flexible structure attached to an electro-mechanical transducer, and a second flexible structure disposed adjacent to the first flexible structure. The second flexible structure having a convex top surface and a concave bottom surface, the convex top surface of the second flexible structure being in contact with the bottom surface of the first flexible structure.

The second flexible structure forms a curvature. In one embodiment, the curvature bends towards the first flexible structure to form a binding or non-binding contact between the first flexible structure and the second flexible structure. The electro-mechanical transducer vibrates when an input electrical signal is applied. The electro-mechanical transducer transfers the vibration to the second flexible structure through the first flexible structure.

In one embodiment, the acoustic transducer may include a first substrate anchoring the first flexible structure, and a second substrate anchoring the second flexible structure. The first substrate is bonded to the second substrate.

In various examples, the first flexible structure can be a fully clamped diaphragm, a partially clamped diaphragm, or a structure including a beam or a cantilever beam.

In one embodiment, the second flexible structure includes a plurality of layers, for example, a first layer and a second layer. Each layer may have a respective thermal expansion coefficient, the thermal expansion coefficients of two or more layers different from one another. The plurality of layers of the second flexible structure are bonded together. In one example, the second flexible structure forms a curvature having a single concave surface. In another example, the second flexible structure forms a curvature having a plurality of concave surfaces, e.g., a wavy or serpentine shape.

Embodiments disclosed herein provide multiple advantages. In one embodiment, the second flexible structure is a bent diaphragm. The bent diaphragm allows a speaker to be miniaturized and achieve a high sensitivity because the bent diaphragm pushes a sufficient amount of air to produce the desired quality sound.

In one embodiment, the contact between the first flexible structure and the second flexible structure is non-bonding. Not bonding the two structures together avoids introduction of stresses, and can enable the speaker to maintain a stable performance with temperature variations. The structure and fabrication processes are based on well-established semiconductor fabrication technologies and therefore the speaker disclosed herein can be mass produced in a semiconductor wafer fabrication facility. In addition, for different application scenarios, the speaker can be scaled down or up to satisfy different sensitivity requirements with a similar structure or fabrication process.

In one embodiment, the acoustic transducer includes an electro-mechanical transducer. The electro-mechanical transducer transforms the electrical signal to mechanical vibrations, which produce audible sounds. The electromechanical transducer includes a piezoelectric material, e.g., aluminum nitride, quartz, ceramic, etc. The electromechanical transducer further includes electric contacts, e.g., electrodes, electric wires, or the like, wherein electric signal can be applied to the piezoelectric material through the electric contacts. In one embodiment, the electric contact can include aluminum (Al), copper (Cu), silver (Ag), gold (Au), etc. The electric signal may represent the desired sound track to be transformed from an electrical form to a mechanical vibration form that produces audible sounds.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the concepts and specific embodiments disclosed herein may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed systems and methods, reference is now made to the following descriptions taken in conjunction with the accompanying drawings.

FIG. 4A is a schematic view of an exemplary second flexible structure of the acoustic transducer at an elevated temperature (higher than room temperature) according to embodiments of the disclosure.

FIG. 4B is a schematic view of exemplary second flexible structures of the acoustic transducer at a room temperature according to embodiments of the disclosure.

DETAILED DESCRIPTIONS

For a more complete understanding of the disclosed systems and methods, reference is now made to the following descriptions taken in conjunction with the accompanying drawings. Various embodiments of this disclosure that are proposed as examples will be described in detail with reference to the following figures, wherein like numerals reference like elements.

Figure 1A:
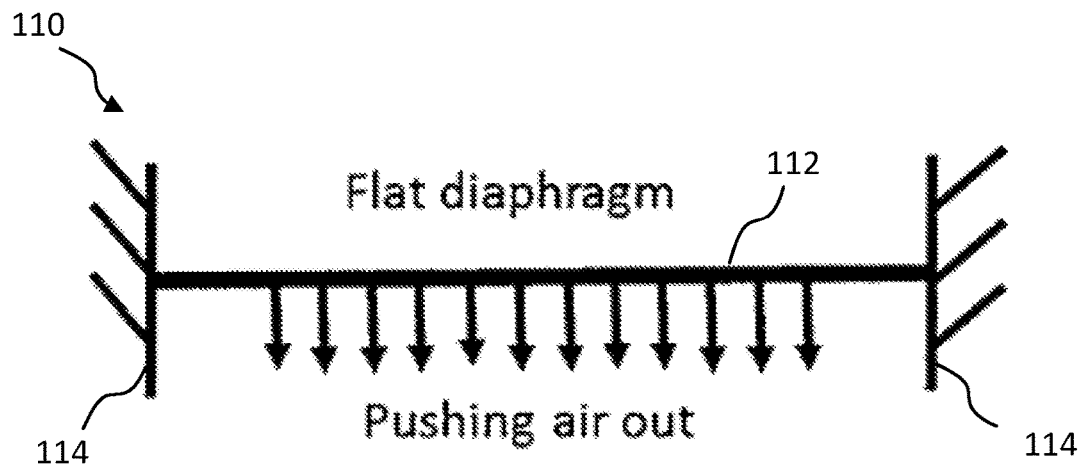
FIG. 1A is a schematic view of an example acoustic transducer having a flat diaphragm according to one embodiment of the disclosure.

FIG. 1A shows an example acoustic transducer 110 having a flat diaphragm 112 according to one embodiment of the disclosure. The flat diaphragm 112 can be anchored in a substrate 114. The flat diaphragm 112 can be attached to an electro-mechanical transducer, for example a piezoelectric transducer, which vibrates when an electrical signal is applied to the transducer. When the flat diaphragm 112 vibrates, it pushes air away as indicated in FIG. 1A.

Figure 1B:
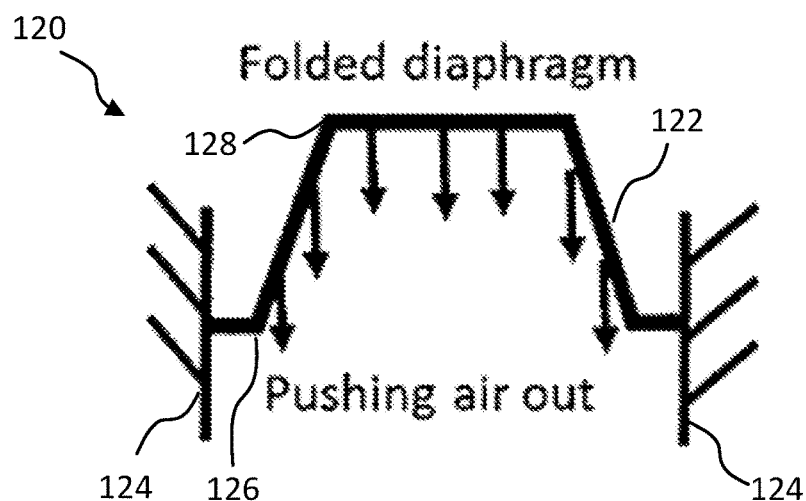
FIG. 1B is a schematic view of an example acoustic transducer having a folded diaphragm according to one embodiment of the disclosure.

FIG. 1B shows an example acoustic transducer 120 having a folded diaphragm 122 according to one embodiment of the disclosure. The folded diaphragm 122 can be anchored in a substrate 124. The folded diaphragm 122 has a lower turning point 126 and a higher turning point 128. In one embodiment, the portion of the diaphragm 122 between substrate 124 and the lower turning point 126 is flat or relatively flat. The portion of the diaphragm 122 between the lower turning point 126 and the higher turning point 128 is rising from a side sectional view. The portion between two higher turning points 128 is flat or relatively flat. The folded diaphragm 122 can be attached to a piezoelectric transducer which vibrates when an electrical signal is applied to the transducer. When the folded diaphragm 122 vibrates, it pushes air away as indicated in FIG. 1B.

Figure 1C:
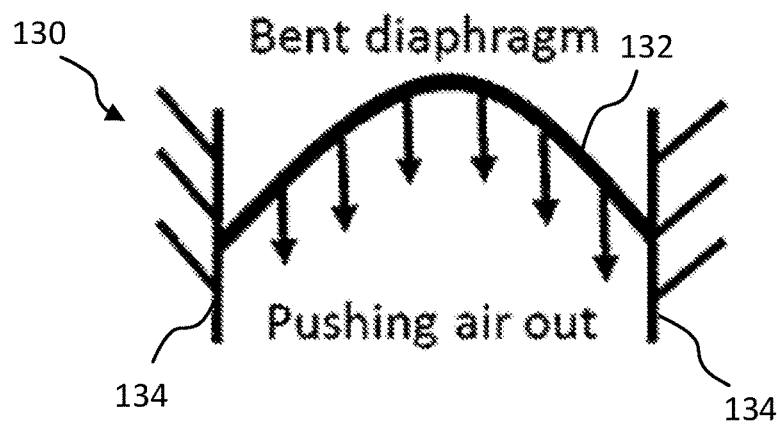
FIG. 1C is a schematic view of an example acoustic transducer having a bent diaphragm according to one embodiment of the disclosure.

FIG. 1C shows an example acoustic transducer 130 having a bent diaphragm 132 according to one embodiment of the disclosure. The bent diaphragm 132 can be anchored in substrate 134. The bent diaphragm 132 includes a convex top surface and a concave bottom surface. The convex top surface has a peak pointing upward. The bent diaphragm 132 can be attached to a piezoelectric transducer which vibrates when an electrical signal is applied to the transducer. When the bent diaphragm 132 vibrates, it pushes air away as indicated in FIG. 1C.

Figure 2A:
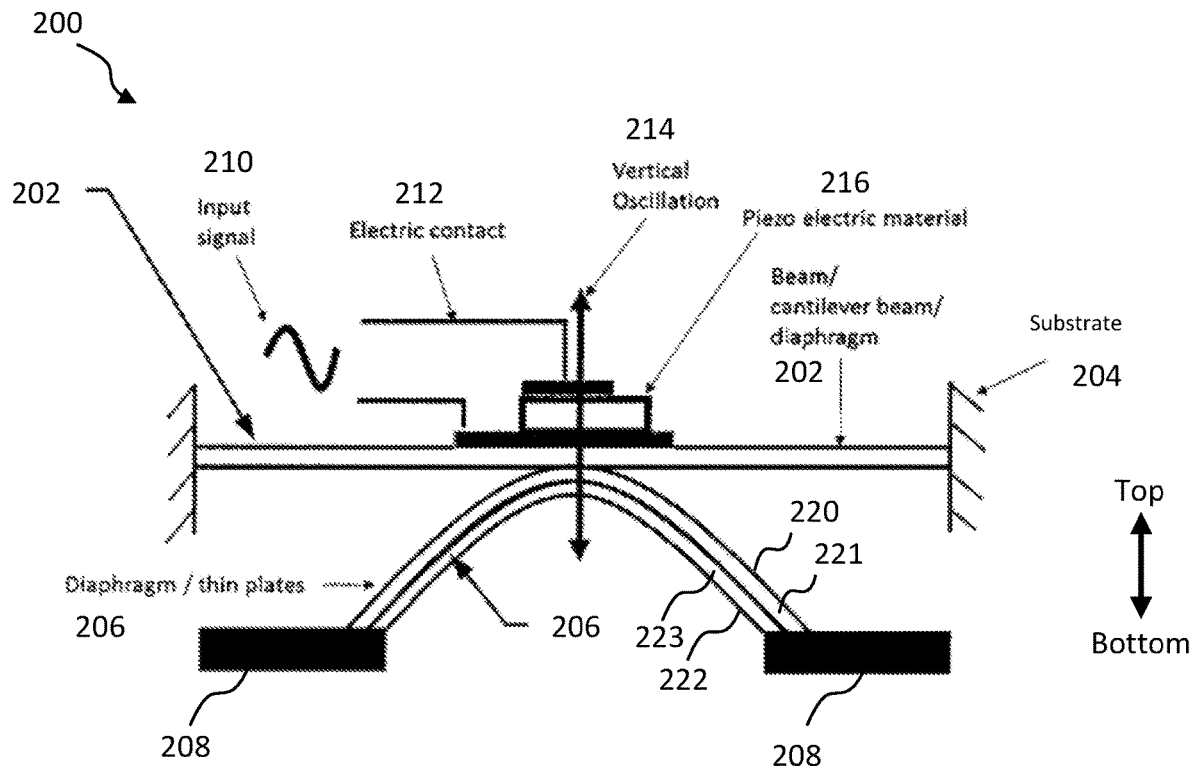
FIG. 2A is a cross sectional view of an acoustic transducer in a static mode according to some embodiments of the disclosure.

FIG. 2A is a cross sectional view that shows an acoustic transducer 200 illustrating its structure in a static mode according to some embodiments of the disclosure. In one embodiment, the acoustic transducer 200 can be a MEMS speaker. The acoustic transducer 200 includes a first flexible structure 202. The first flexible structure 202 includes a top surface and a bottom surface. A piezoelectric material 216 is attached to the top surface of the first flexible structure 202. The bottom surface of the first flexible structure 202 is in contact with a top surface of a second flexible structure 206. In some embodiments, the diaphragm 112 of FIG. 1A, the diaphragm 122 of FIG. 1B, and/or the diaphragm 132 of FIG. 1C can be the second flexible structure 206.

The piezoelectric material 216 produces vertical vibration 214 when an input electrical signal 210 is applied to the piezoelectric material 216. The piezoelectric material 216 is electrically contacting electric contacts 212, e.g., electrodes, to receive the input electrical signal 210. In one embodiment, the electric contacts 212 can include aluminum (Al), copper (Cu), silver (Ag), gold (Au), etc.

In one embodiment, the input electrical signal 210 represents the sound track to be transformed into sound waves by the acoustic transducer 200.

In one embodiment, the acoustic transducer 200 includes an electro-mechanical transducer. See electro-mechanical transducer 315 in FIG. 3. The electro-mechanical transducer includes the piezoelectric material 216, e.g., aluminum nitride, quartz, ceramic, etc. The electro-mechanical transducer also includes electric contacts 212, e.g., electrodes, electric wires, or the like, wherein electric signal 210 can be applied to the piezoelectric material 216 through the electric contacts 212. The electric signal 210 may represent the sound track to be transformed from an electrical signal form to a mechanical vibration 214 form producing sounds.

The first flexible structure 202 can be one or more beams, one or more cantilever beams, one or more thin films, and one or more diaphragms. In one embodiment, the first flexible structure 202 is anchored and/or mounted in a substrate 204. The substrate 204 can be any suitable semiconductor substrate, e.g., silicon, silicon oxide, etc.

The second flexible structure 206 has a convex top surface 220 and a concave bottom surface 222. The convex top surface 220 is in contact with the bottom surface of the first flexible structure 202. The contact between the first flexible structure 202 and the second flexible structure 206 can be bonded or not bonded.

In one embodiment, the contact between the first flexible structure 202 and the second flexible structure 206 is not bonded. A non-bonded contact allows the first flexible structure 202 and the second flexible structure 206 to make relative movements, which reduces the mechanical stress that may damage the structure during vibration. In another embodiment, the contact between the first flexible structure 202 and the second flexible structure 206 is bonded. A bonded contact allows a more sensitive transfer of vibration from the first flexible structure 202 to the second flexible structure 206.

As shown in FIG. 2A, the second flexible structure 206 includes two different layers, the first layer 221 and the second layer 223. In one embodiment, the first layer 221 and the second layer 223 may be bonded together. In another embodiment, the first layer 221 and the second layer 223 may be in contact with each other but not bonded.

The first layer 221 can be made with a first material. The second layer 223 can be made with a second material. The first material and the second material have different thermal expansion coefficients. In a process of making the curved second flexible structure 206, the first layer 221 is deposited on top of the second layer 223 at a temperature higher than a room temperature. When the temperature cools down to the room temperature, the first layer 221 and the second layer 223 naturally bend, forming a curvature. The natural bending of the second flexible structure 206 occurs while cooling down. The natural bending of the second flexible structure 206 occurs because the different contraction rates of the different thermal expansion coefficients while cooling down cause a mechanical stress that bends the second flexible structure 206. In one embodiment, the curvature of the second flexible structure 206 forms a single arc. See also FIG. 8A. In another embodiment, different materials with different thermal expansion coefficients can be deposited in various patterns, such that the curvature of the second flexible structure 206 forms multiple arcs. See also FIG. 8B.

The second flexible structure 206 can be one or more beams, one or more cantilever beams, one or more thin films, and one or more diaphragms.

Figure 2B:
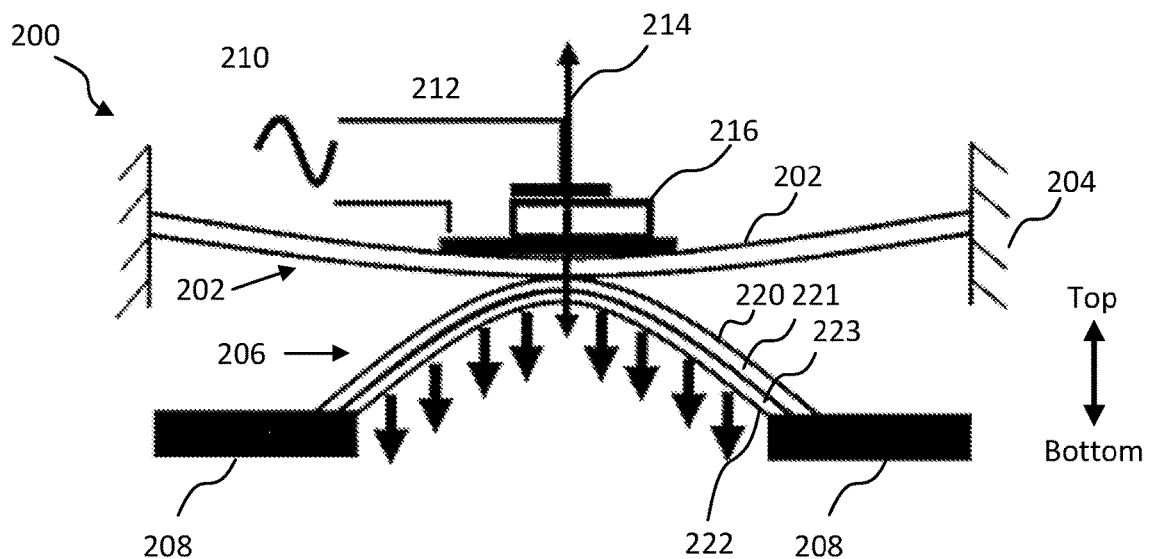
FIG. 2B shows a cross sectional view of an acoustic transducer in a deformation mode according to some embodiments of the disclosure.

FIG. 2B is a cross sectional view showing an acoustic transducer 200 illustrating its structure in a deformation mode according to some embodiments of the disclosure. When the piezoelectric material 216 receives electrical signal 210 through the electric contacts 212, the piezoelectric material 216 vibrates causing vertical oscillation 214. The vertical oscillation 214 causes deformation of the first flexible structure 202. The deformation of the first flexible structure 202 further causes deformation of the second flexible structure 206. When the second flexible structure 206 is deformed, air on the side of the bottom concave surface 222 is pushed away from the second flexible structure 206.

The vibrations produced by the piezoelectric material 216 are passed on to the second flexible structure 206, through the first flexible structure 202. This also means the mechanical energy of the vibrations produced by the piezoelectric material 216 is transferred to the first flexible structure 202 and to the second flexible structure 206.

Figure 3:
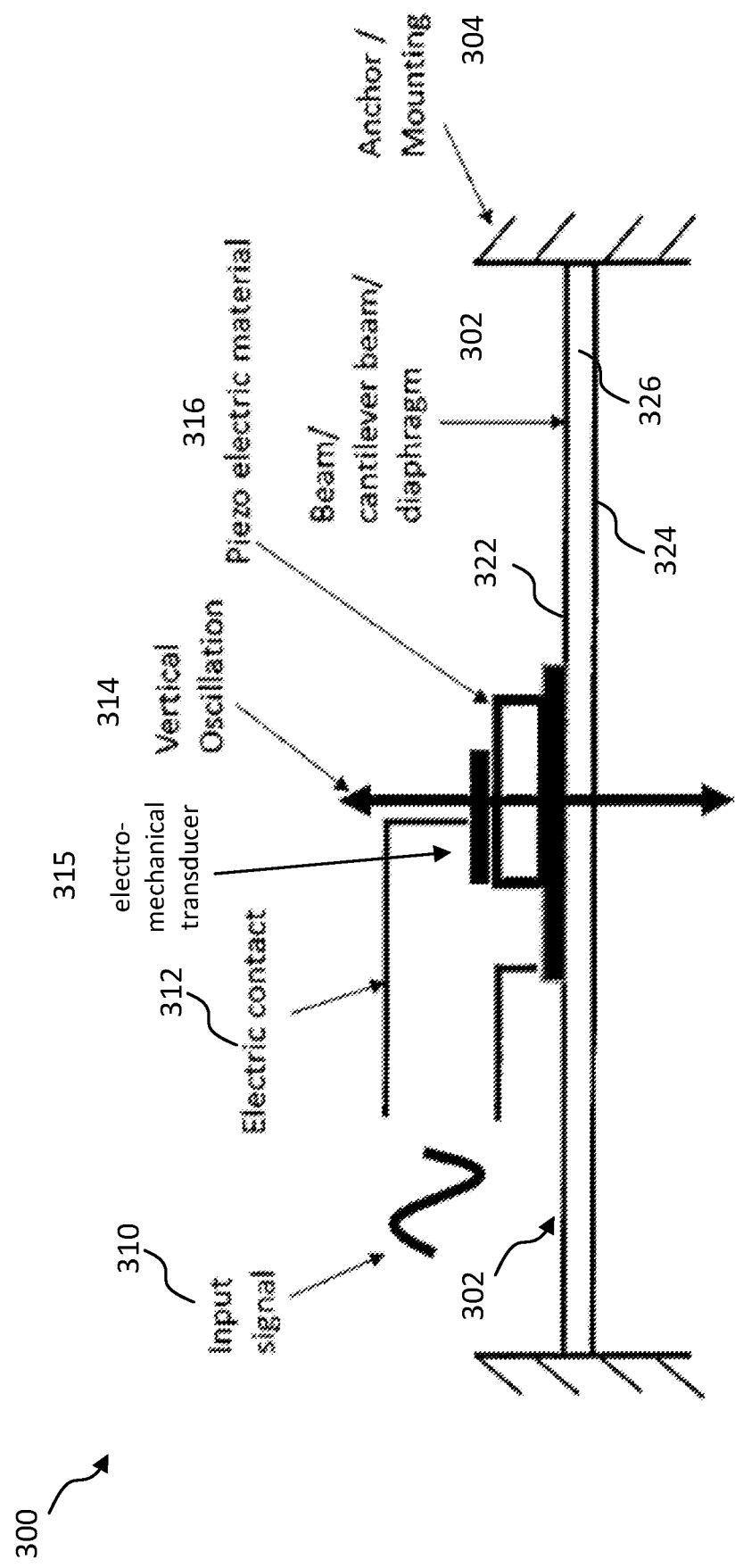
FIG. 3 is a schematic view of an exemplary first flexible structure of an acoustic transducer according to one embodiment of the disclosure.

FIG. 3 shows an exemplary first flexible structure 302 of an acoustic transducer 300 according to one embodiment of the disclosure. The acoustic transducer 300 includes a first flexible structure 302. The first flexible structure 302 includes a top surface 322 and a bottom surface 324. The first flexible structure 302 can be a beam, a cantilever beam, a film, and/or a diaphragm.

An electro-mechanical transducer 315 is attached to the top surface 322 of the first flexible structure 302. The electro-mechanical transducer 315 includes the piezoelectric material and electric contacts 312. In one embodiment, the bottom surface 324 of the first flexible structure 302 can be in contact with a second flexible structure. In one embodiment, the electric contact 312 can include aluminum (Al), copper (Cu), silver (Ag), gold (Au), etc.

The piezoelectric material 316 of the electro-mechanical transducer 315 produces vertical vibrations 314 when an input electrical signal 310 is applied to the piezoelectric material 316 through the electric contacts 312. The electro-mechanical transducer 315 includes electric contacts 312, e.g., electrodes, to receive the input electrical signal 310. The piezoelectric material 316 transforms the electrical signal to mechanical vibrations which then produces soundwaves. In one embodiment, the input electrical signal 310 represents the sound track to be transformed from electrical signal into sound wave by the acoustic transducer 300. The first flexible structure 302 can be one or more beams, one or more cantilever beams, one or more thin films, and one or more diaphragms. In one embodiment, the first flexible structure 302 is anchored and/or mounted in the substrate 304. The substrate 304 can be any suitable semiconductor substrate, e.g., silicon, silicon oxide, etc.

FIG. 4A shows examples of a second flexible structure 400 of an acoustic transducer at an elevated temperature (higher than room temperature) according to embodiments of the disclosure. As shown in FIG. 4A, the second flexible structure 400 includes a first material 402 and a second material 404. The first material 402 has a first thermal expansion coefficient (TEC-1) 403. The second material 404 has a second thermal expansion coefficient (TEC-2) 405. The TEC-1 403 is different from the TEC-2 405.

The first material 402 forms a first layer 408 of the second flexible structure 400 of the acoustic transducer. The first layer 408 has a top surface 406 and a bottom surface 410. The second material 404 forms a second layer 414 of the second flexible structure 400 of the acoustic transducer. The second layer 414 has a top surface 412 and a bottom surface 416.

In one embodiment, during the semiconductor manufacture process, the acoustic transducer is heated to an elevated temperature higher than room temperature. The first material 402 and the second material 404 are deposited as part of the acoustic transducer under the elevated temperature. Under the elevated temperature, the first layer 408 and the second layer 414 remain straight from a sectional view as in FIG. 4A. The second flexible structure 400 of the acoustic transducer naturally bends when the temperature cools down to room temperature, as shown in FIG. 4B, because the TEC-1 403 of the first material 402 is different from the TEC-2 405 of the second material 404.

FIG. 4B shows examples of a second flexible structure 400 of an acoustic transducer at a room temperature according to embodiments of the disclosure. For the purpose of this disclosure, a thermal expansion coefficient (TEC) larger in value means a linear expansion rate when heated up or contraction rate when cooled down of a material is greater. Vice versa, a TEC smaller in value means a linear expansion rate when heated up or contraction rate when cooled down of a material is smaller.

FIG. 4B shows the second flexible structure 400 of the acoustic transducer having a convex top surface 406 and a concave bottom surface 416. The peak of the arc formed by the second flexible structure 400 of the acoustic transducer is pointing toward the top direction (upward). FIG. 4B also shows a different second flexible structure 400' of the acoustic transducer having a concave top surface 406' and a convex bottom surface 416'. The peak of the arc formed by the second flexible structure of the acoustic transducer 400' is pointing toward the bottom direction (downward).

The second flexible structure of the acoustic transducer 400 forms an arc having a convex top surface 406 and a concave bottom surface 416. The convex top surface 406 is the top surface of the first layer 408. The first layer 408 has a bottom surface 410. The concave bottom surface 416 is the bottom surface of the second layer 414. The second layer 414 has a top surface 412. The bottom surface 410 of the first layer 408 is in contact with the top surface 412 of the second layer 414. The contact can be bonded or not bonded.

The second flexible structure of the acoustic transducer 400' forms an arc having a concave top surface 406' and a convex bottom surface 416'. The concave top surface 406' is the top surface of the first layer 408'. The first layer 408' has a bottom surface 410'. The convex bottom surface 416' is the bottom surface of the second layer 414'. The second layer 414' has a top surface 412'. The bottom surface 410' of the first layer 408' is in contact with the top surface 412' of the second layer 414'. The contact can be bonded or not bonded.

In the second flexible structure of the acoustic transducer 400, the TEC-1 of the first material 402 is smaller than the TEC-2 of the second material 404. When the acoustic transducer cools down from an elevated temperature, the second material 404 contracts more than the first material 402, forming an upward pointing arc.

In the second flexible structure of the acoustic transducer 400', the TEC-1 of the first material 402' is larger than the TEC-2 of the second material 404'. When the acoustic transducer cools down from an elevated temperature, the second material 404' contracts less than the first material 402', forming an downward pointing arc.

Figure 5:
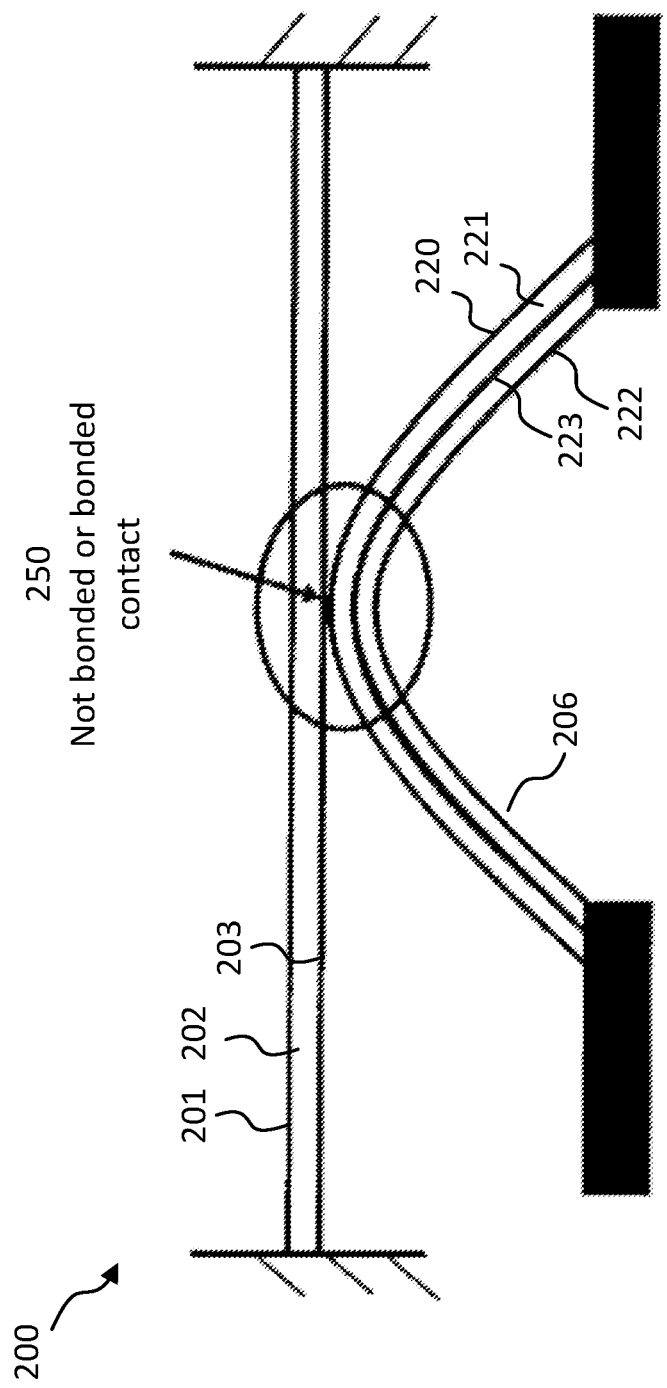
FIG. 5 is a schematic view of illustrating how the first flexible structure and the second flexible structure interface with each other according to an embodiment of the disclosure.

FIG. 5 shows an example of how the first flexible structure 202 and the second flexible structure 206 being interfaced with each other according to an embodiment of the disclosure. The first flexible structure 202 includes a top surface 201 and a bottom surface 203. The second flexible structure 206 includes a convex top surface 220 and a concave bottom surface 222.

A contact 250 is formed between the bottom surface 203 of the first flexible structure 202 and the convex top surface 220 of the second flexible structure 206. The contact 250 can be bonded or not bonded contact.

In one embodiment, the contact 250 is not bonded. A non-bonded contact allows the first flexible structure 202 and the second flexible structure 206 to make relative movements, which reduces the mechanical stress that may damage the structure of the device 200 during vibration. In another embodiment, the contact 250 between the first flexible structure 202 and the second flexible structure 206 is bonded. A bonded contact allows a more sensitive transfer of vibration from the first flexible structure 202 to the second flexible structure 206.

Figure 6A:
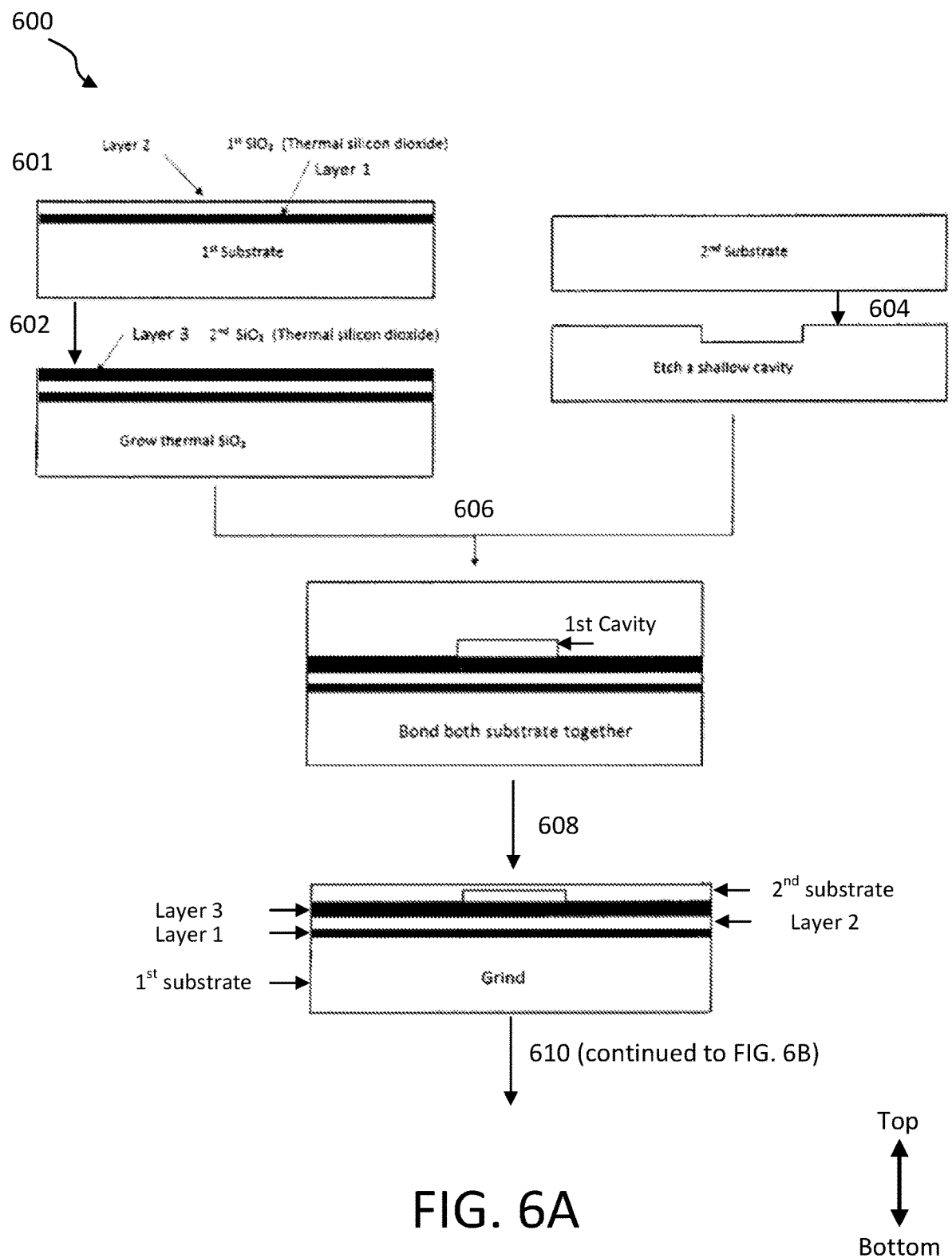
FIG. 6A is a flow diagram that shows a portion of an example fabrication process for fabricating an acoustic transducer according to one embodiment of the disclosure.
Figure 6B:
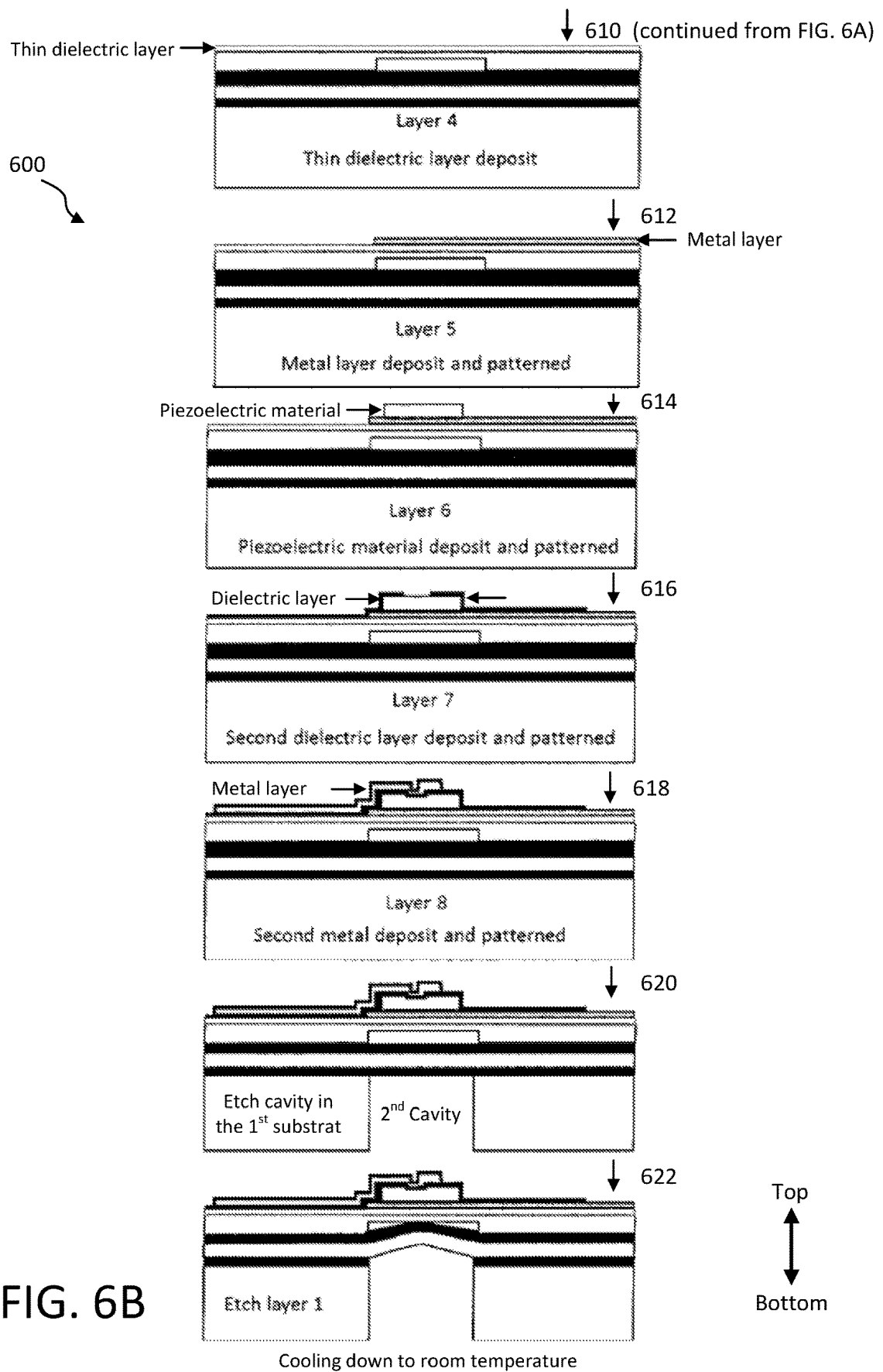
FIG. 6B is a flow diagram that shows a portion of an example fabrication process for fabricating an acoustic transducer according to one embodiment of the disclosure.
Figure 6C:
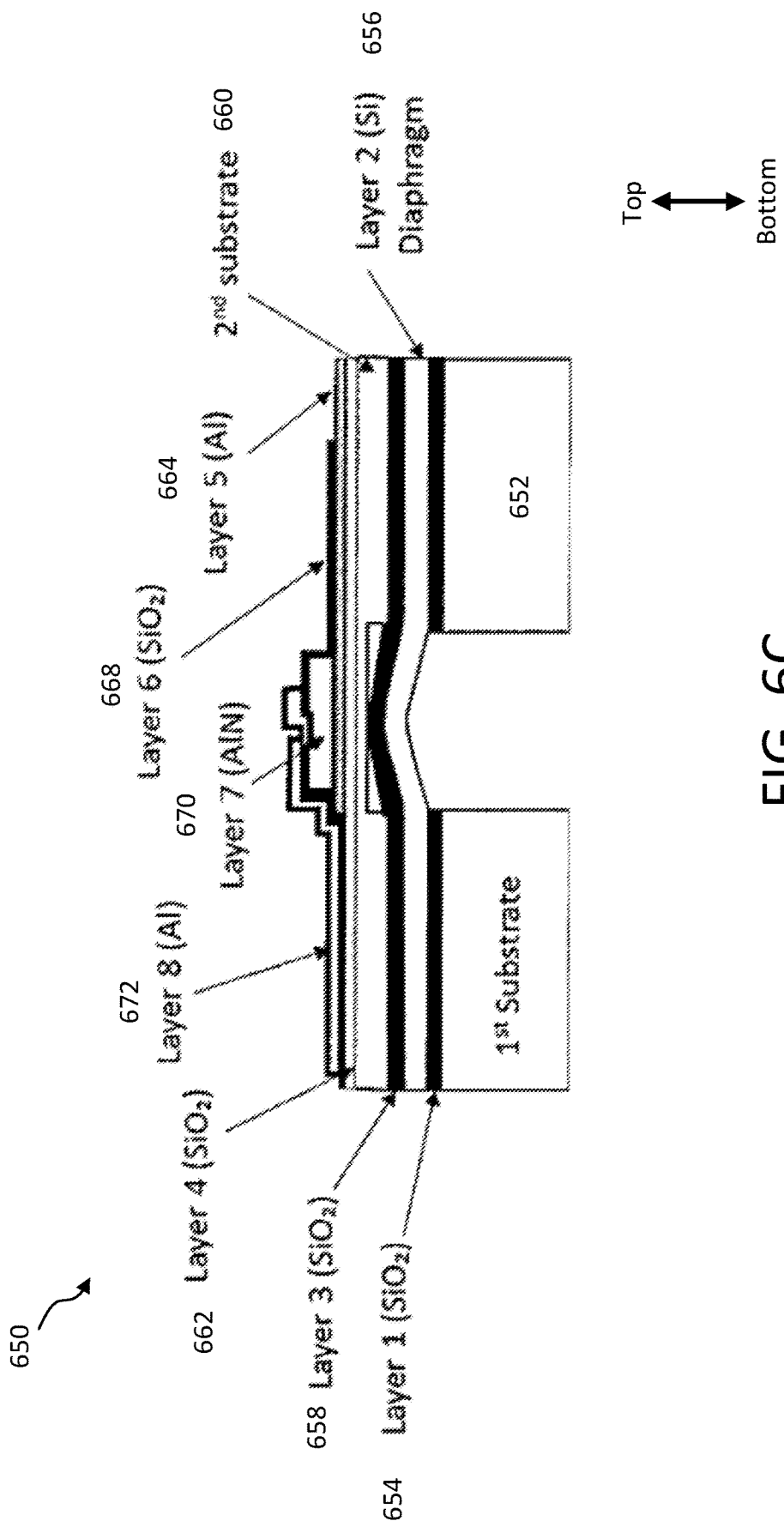
FIG. 6C is a side elevational view that shows an acoustic transducer made by the fabrication process illustrated in FIGS. 6A-6B according to one embodiment of the disclosure.

FIGS. 6A-6B show an example fabrication process 600 for fabricating an acoustic transducer 650 according to one embodiment of the disclosure. FIG. 6C shows an acoustic transducer 650 made by the fabrication process 600 illustrated in FIGS. 6A-6B according to one embodiment of the disclosure. It is noted that fabrication process 600 is only an example for fabricating an acoustic transducer 650. In various examples, various fabrication processes may be used to obtain an acoustic transducer having a similar structure as that shown in FIG. 6C. In some examples, corresponding to the FIGS. 6A-6B process, different materials and/or processing techniques may be adopted to fabricate a speaker having a similar structure as shown in FIG. 6C example. In some other examples, the adopted fabrication processes may include acts different from the FIGS. 6A-6B example, or may include the acts in the FIGS. 6A-6B example but performed in a different order.

The fabrication process 600 includes 601 depositing a first layer on the first substrate and depositing a second layer on top of the first layer. The first substrate can be any suitable semiconductor substrate, e.g., silicon (Si), germanium (Ge), or the like. The first substrate can be doped with any suitable atoms, e.g., phosphorus (P), arsenic (As), boron (B), aluminum (Al), gallium (Ga), or the like.

As shown in FIG. 6A, the first layer can be an dielectric layer, e.g., an silicon dioxide (SiO2) layer. The second layer can be any suitable semiconductor material, e.g., silicon (Si), germanium (Ge), or the like. The second layer can be doped with any suitable atoms, e.g., phosphorus (P), arsenic (As), boron (B), aluminum (Al), gallium (Ga), or the like.

The fabrication process 600 includes 602 depositing a third layer on top of the second layer. The third layer can be an dielectric layer, e.g., an silicon dioxide (SiO2) layer. In one embodiment, the second layer and the third layer can be the second flexible structure 206 as shown in FIG. 2A.

The fabrication process 600 includes 604 etching a first cavity on the second substrate. The second substrate can be any suitable semiconductor substrate, e.g., silicon (Si), germanium (Ge), or the like. The second substrate can be doped with any suitable atoms, e.g., phosphorus (P), arsenic (As), boron (B), aluminum (Al), gallium (Ga), or the like.

The fabrication process 600 includes 606 bonding the processed first substrate with the second substrate such that the first cavity is circumscribed or defined by the second substrate and the third layer. The first cavity has a perimeter defined in part by the second substrate and in part by the third layer.

The fabrication process 600 includes 608 grinding the second substrate to make the portion above the first cavity a thin layer. In one embodiment, this thin layer over the first cavity can be the first flexible structure 202 as shown in FIG. 2A.

The fabrication process 600 includes 610 (continued to FIG. 6B) depositing a thin dielectric layer, e.g., a silicon dioxide ($SiO_2$) layer on top of the second substrate.

The fabrication process 600 includes 612 depositing a metal layer. At 612, This metal layer covers over the cavity portion. In one embodiment, this metal layer at 612 is one electrical contact of the electro-mechanical transducer. In one embodiment, the metal layer can be aluminum (Al), copper (Cu), silver (Ag), gold (Au), etc.

The fabrication process 600 includes 614 depositing a piezoelectric material on top of the metal layer of 612. At 614, the piezoelectric material is deposited over the cavity. In one embodiment, the piezoelectric material is the material transforming the electrical signal to mechanical vibrations.

The fabrication process 600 includes 616 depositing a dielectric layer partially covering a top surface of the piezoelectric material. At 616, the dielectric layer does not cover the entire top surface of the piezoelectric material. The dielectric layer leaves a gap over the top surface of the piezoelectric material. This gap allows a formation of an electrical contact with the piezoelectric material if another metal layer is deposited.

The fabrication process 600 includes 618 depositing a metal layer, partially on top of the dielectric layer of 616 and partially on top of the piezoelectric material of 614. At 618, this metal layer fills in the gap of the dielectric layer of 616 over the piezoelectric material of 614, forming a second electrical contact with the piezoelectric material. In one embodiment, the metal layer can be aluminum (Al), copper (Cu), silver (Ag), gold (Au), etc.

The fabrication process 600 includes 620 etching the first substrate to create a second cavity. The second cavity created at 620 is located beneath the first cavity created at 604 and 606.

The fabrication process 600 includes 622 etching the first layer of 601 away underneath the first cavity. The etched away portion of the first layer becomes part of the second cavity. At 622, the fabrication process 600 also includes cooling down the acoustic transducer from an elevated temperature to room temperature. Because the second layer and the third layer each has a different thermal expansion coefficient, the second layer and the third layer located between the first cavity and the second cavity naturally bend forming a curvature. As shown in 622 of FIG. 6B, the second layer and the third layer disposed in-between the first and second cavity can be the second flexible structure 206 as shown in FIG. 2A.

In the fabrication process 600, after etching the first layer (silicon dioxide) inside the second cavity of the first substrate at 622, the diaphragm formed by the second and third layers bows upward due to a stress caused by the thermal expansion coefficient mismatch between the second and the third layers. The diaphragm (layer 2 and layer 3) goes upward and pushes against the thin film portion of the second substrate, forming a non-binding contact. Thus, as shown in FIGS. 6A-6B, there is no permanent attachment between the diaphragm (e.g., the second flexible structure 206) and the thin film portion of the second substrate (e.g., the first flexible structure 202), wherein they naturally touch each other. This non-bonded contact reduces the potential mechanical stress caused by vibrations. On the contrary, when the diaphragm and the second substrate are bonded with each other, mechanical stresses may be induced causing degradation of the performance of the speaker.

Figure 7:
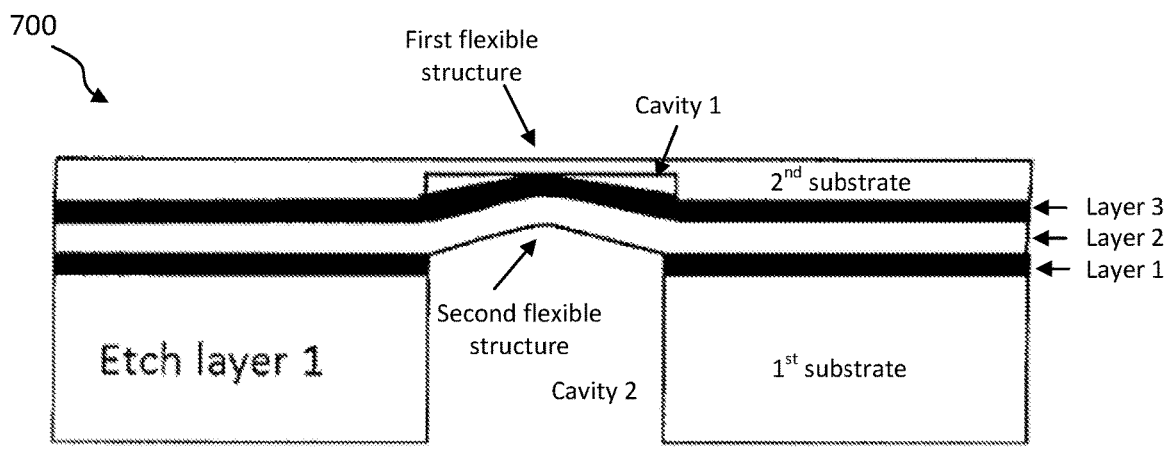
FIG. 7 is a side elevational view that shows an acoustic transducer made using a portion of the fabrication process according to one embodiment of the disclosure.

Yet, in alternative examples, the diaphragm and the second substrate can be permanently bonded by growing a thin layer of silicon dioxide when the diaphragm (second and third layers between the first and second cavities) and the second substrate are in contact. For example, the acts 610, 612, 614, 616, 618, would be performed after 620, and 622 where the contact between the diaphragm (second and third layers between the first and second cavities) and the second substrate place is formed. A device (a partially completed acoustic transducer) made following acts 601, 602, 604, 606, 608, 620, 622 is shown in FIG. 7.

FIG. 6C shows the final acoustic transducer 650 made with the fabrication process 600. The transducer 650 includes from bottom to top: first substrate 652, the first layer 654, the second layer 656, the third layer 658, the second substrate 660, the fourth layer 662, the fifth layer 664, the sixth layer 668, the seventh layer 670, the eight layer 672.

The first substrate 652 can be any suitable semiconductor substrate with or without any doping. The first layer 654 can be a dielectric layer, e.g., SiO2. The second layer 656 can be any semiconductor material with or without any doping. The third layer 658 can be a dielectric layer, e.g., SiO2. The second substrate 660 can be any suitable semiconductor substrate with or without any doping. The fourth layer 662 can be a dielectric layer, e.g., SiO2. The fifth layer 664 can be a metal layer, e.g., Aluminum (Al). The sixth layer 668 can be a dielectric layer, e.g., SiO2. The seventh layer 670 can be a piezoelectric material, e.g., aluminum nitride (AlN), crystals, quartz, ceramics, or the like. The eighth layer 672 can be a metal layer, e.g., Aluminum (Al).

The configuration and rigidity of the diaphragm (second and third layers between the first and second cavities) can be adjusted in order to increase or decrease a travel distance during oscillation of the diaphragm. For example, the diaphragm can be shaped to realize the adjustment.

FIG. 7 shows an acoustic transducer 700 made in the following acts using a portion of the fabrication process 600 in the order: 601, 602, 604, 606, 608, 620, and 622. As previously discussed, using the acoustic transducer 700 and further applying acts 610 (for forming fourth layer), 612 (for forming fifth layer), 614 (for forming sixth layer), 616 (for forming seventh layer), and 618 (for forming eighth layer), the contact between the diaphragm (second and third layers between the first and second cavities) and the second substrate forms a bonded contact. Such bonded contact may provide better transfer of the mechanical vibrations from the piezoelectric material to the second flexible structure through the first flexible structure.

Figure 8A:
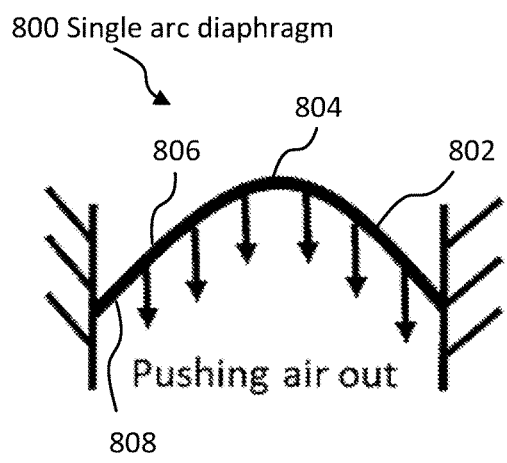
FIG. 8A is a schematic side sectional view of a diaphragm forming a single arc according to some embodiments of the disclosure.
Figure 8B:
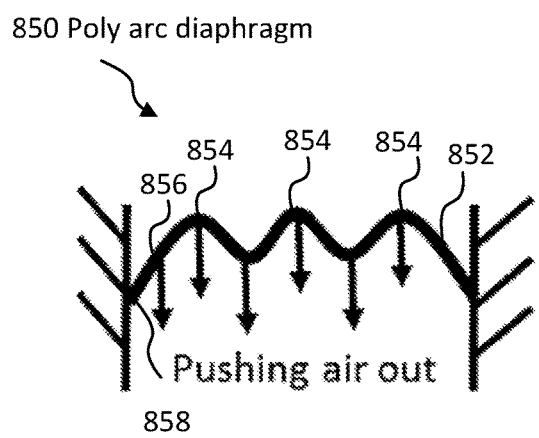
FIG. 8B is a schematic side sectional view of a diaphragm forming multiple arcs according to some embodiments of the disclosure.

FIGS. 8A and 8B show two alternative embodiments of diaphragms 800, 850 respectively, according to some embodiments of the disclosure. Diaphragms 800, 850 can be applied as the second flexible structure 206 as shown in FIGS. 2A and 2B. As shown in FIG. 8A, diaphragm 800 includes a single arc 802 having a single peak 804 pointing upward. The diaphragm 800 includes a convex top surface 806 and a concave bottom surface 808. As previously shown in FIGS. 6A and 6B, the single arc diaphragm 800 can include a single-silicon layer, the second layer 656.

As shown in FIG. 8B, the poly arc diaphragm 850 includes a polysilicon layer, instead for a single-silicon layer, for the second layer 656. Such polysilicon layer induces a wavy diaphragm once the polysilicon layer is cooled down from an elevated temperature due to the uneven thermal expansion coefficient. As shown in FIG. 8B, the poly arc diaphragm 850 is a multiple arc curvature 852 from a sectional view. The multiple arc curvature 852 includes multiple peaks 854. The poly arc diaphragm 850 includes a top surface 856 and a bottom surface 858. In one embodiment, at least a portion of the top surface 856 is in contact with a first flexible structure 202 which is further attached to a piezoelectric material 216. The mechanical vibration 214 produced by the piezoelectric material 216 can be transferred to the poly arc diaphragm 850. This poly arc diaphragm enables the diaphragm to travel a longer distance with a lesser force applied. This means the acoustic transducer using the poly arc diaphragm 850 can push out more air and produce a high quality of sound.

Figure 9:
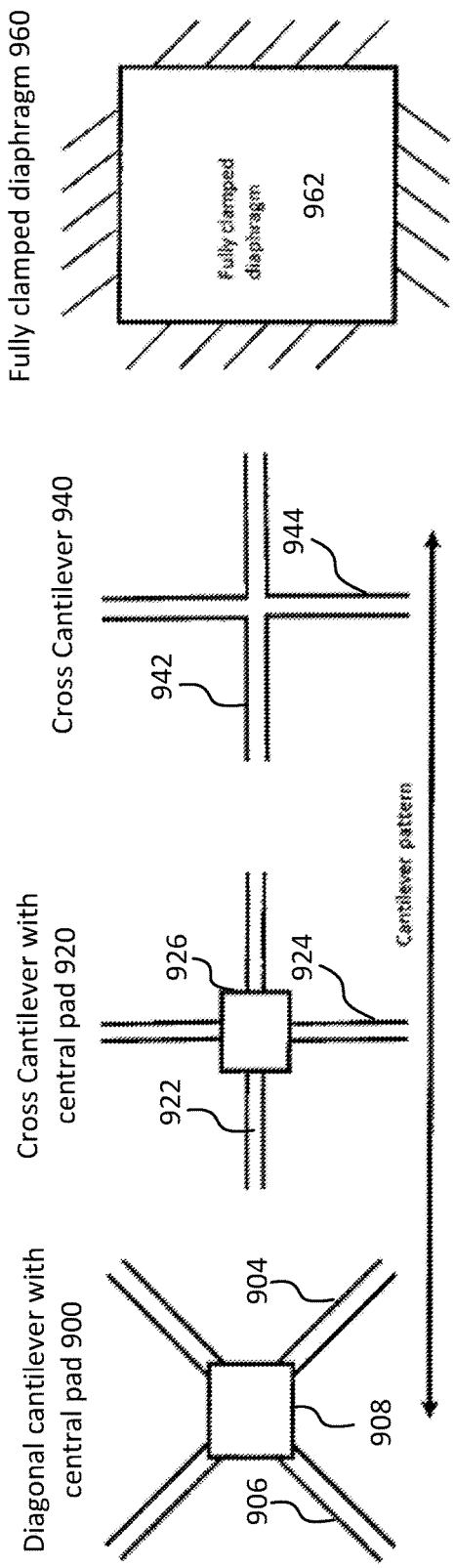
FIG. 9 is a schematic view that shows various embodiments of a first flexible structure from a top plan view that supports a piezoelectric material according to the disclosure.

FIG. 9 shows various embodiments of a first flexible structure 202 from a top view that supports a piezoelectric material according to the disclosure. The first flexible structure 202 as shown in FIGS. 2A and 2B can be formed with multiple options.

In one embodiment, the first flexible structure 202 can be a diagonal cantilever with central pad 900. This structure of 900 includes a first beam 904 and a second beam 906 crossing each other diagonally. The structure of 900 further includes a supporting pad 908 disposed at the cross section of the first 904 and second 906 beams, wherein the diagonals of the supporting pad 908 are parallel to the first 904 and second 906 beams. In one embodiment, the supporting pad 908 supports the electro-mechanical transducer.

In one embodiment, the first flexible structure 202 can be a cross cantilever with central pad 920. The structure of 920 includes a first beam 922 and a second beam 924 crossing each other orthogonally. The structure of 920 includes a supporting pad 926 disposed at the cross section of the first 922 and second 924 beams. In one embodiment, the supporting pad 926 supports the piezoelectric material.

In one embodiment, the first flexible structure 202 can be a cross cantilever 940. The structure of 940 includes a first beam 942 and a second beam 944 crossing each other orthogonally.

In one embodiment, the first flexible structure 202 can be a fully clamped diaphragm 960. In one embodiment, a perimeter of the fully clamped diaphragm 960 is entirely attached to one or more supporting substrates.

Figure 10:
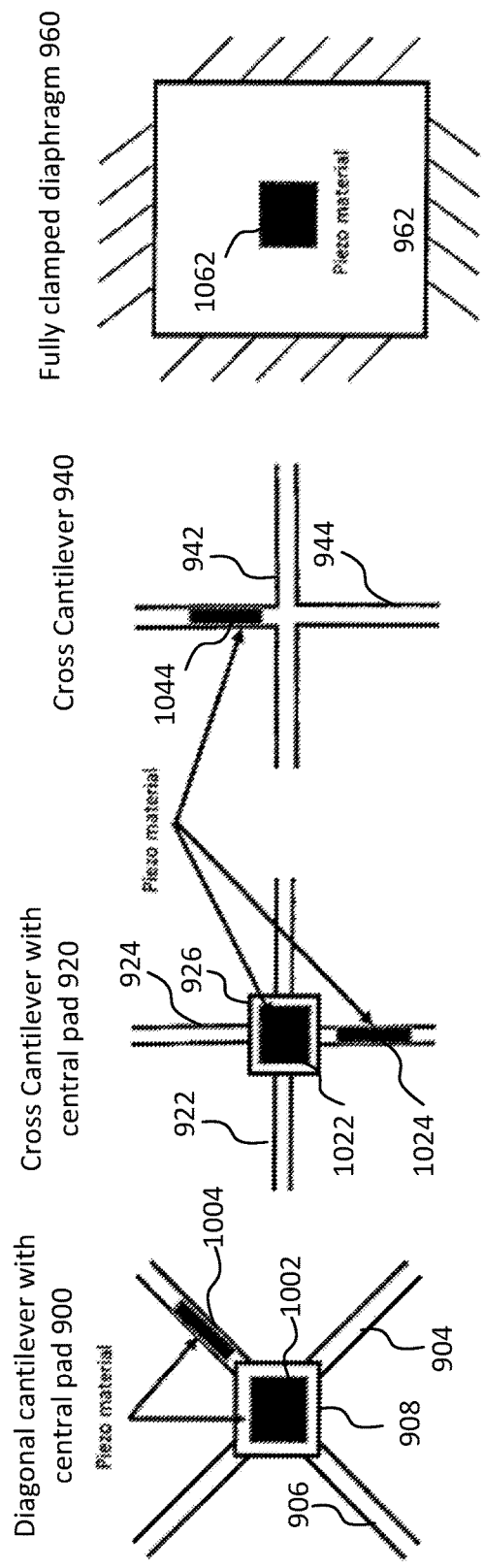
FIG. 10 is a schematic view that shows how piezoelectric material can be disposed on the diagonal cantilever with central pad, cross cantilever with central pad, cross cantilever, and fully clamped diaphragm according to some embodiments of the disclosure.

FIG. 10 shows how one or more electro-mechanical transducer can be disposed on the diagonal cantilever with central pad 900, cross cantilever with central pad 920, cross cantilever 940, and fully clamped diaphragm 960 according to some embodiments of the disclosure.

As shown in FIG. 10, for the diagonal cantilever with central pad 900, a first electro-mechanical transducer 1002 can be disposed on the supporting pad 908. A second electro-mechanical transducer 1004 can be disposed on the second beam 906. In another embodiment, one or more electro-mechanical transducers can be disposed on the supporting pad 908, the first beam 904, and the second beam 906.

As shown in FIG. 10, for the cross cantilever with central pad 920, a first electro-mechanical transducer 1022 can be disposed on the supporting pad 926. A second electro-mechanical transducer 1024 can be disposed on the first beam 924. In another embodiment, one or more electro-mechanical transducers can be disposed on the supporting pad 926, the first beam 922, and the second beam 924.

As shown in FIG. 10, for the cross cantilever 940, a first electro-mechanical transducer 1044 can be disposed on the first beam 944, approximate to the cross section. In another embodiment, one or more electro-mechanical transducers can be disposed on the first beam 942, and the second beam 944.

As shown in FIG. 10, for the fully clamped diaphragm 960, an electro-mechanical transducer 1062 can be disposed near a center of the diaphragm 960. There can be one or more electro-mechanical transducers disposed on the diaphragm 960.

Figure 11:
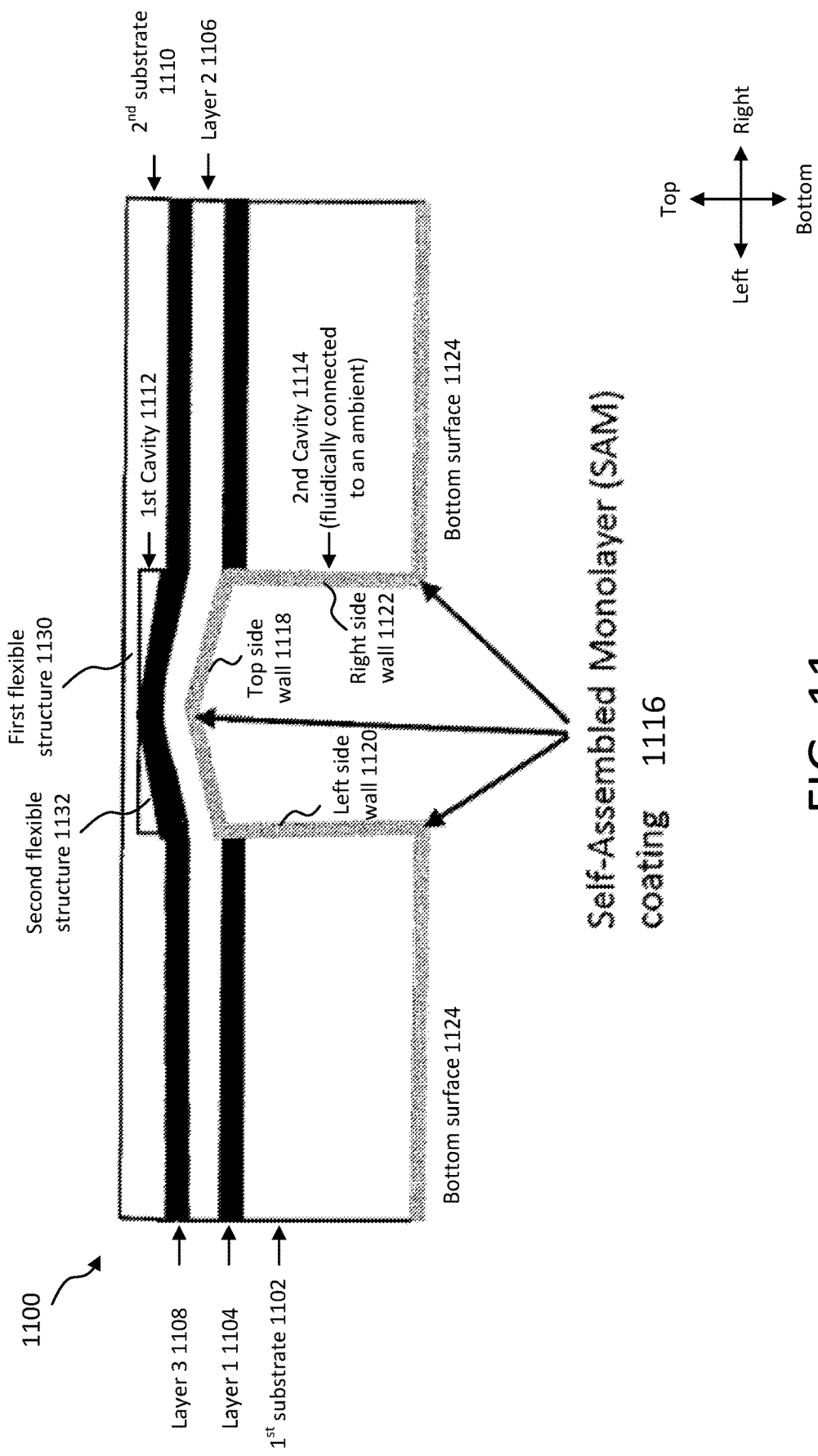
FIG. 11 is a side elevational view that shows an example acoustic transducer with self-assembled monolayers (SAM) coating according to an embodiment of the disclosure.

FIG. 11 shows an example acoustic transducer 1100 with self-assembled monolayers (SAM) coating 1116 according to an embodiment of the disclosure. The acoustic transducer 1100 includes (from bottom to top): first substrate 1102, first layer 1104, second layer 1106, third layer 1108, and the second substrate 1110.

A first cavity 1112 is defined by the second substrate 1110 and the third layer 1108 from a sectional view. The second cavity 1114 is disposed in the first substrate 1102. The second cavity 1114 includes a top side wall 1118, a left side wall 1120, and a right side wall 1122. The second cavity 1114 is fluidically connected to an ambient at the bottom side. When the second flexible structure 1132 is vibrating, the air is pushed out from a bottom side of the second cavity 1114.

The self-assembled monolayer (SAM) coating 1116 can be applied to the top side wall 1118, the left side wall 1120, and/or the right side wall 1122 of the second cavity 1114. The SAM coating 1116 can also be applied to a bottom surface 1124 of the first substrate 1102. In one embodiment, the SAM coating 1116 is hydrophobic that repels water, making the acoustic transducer 1100 water proof.

Figure 12:
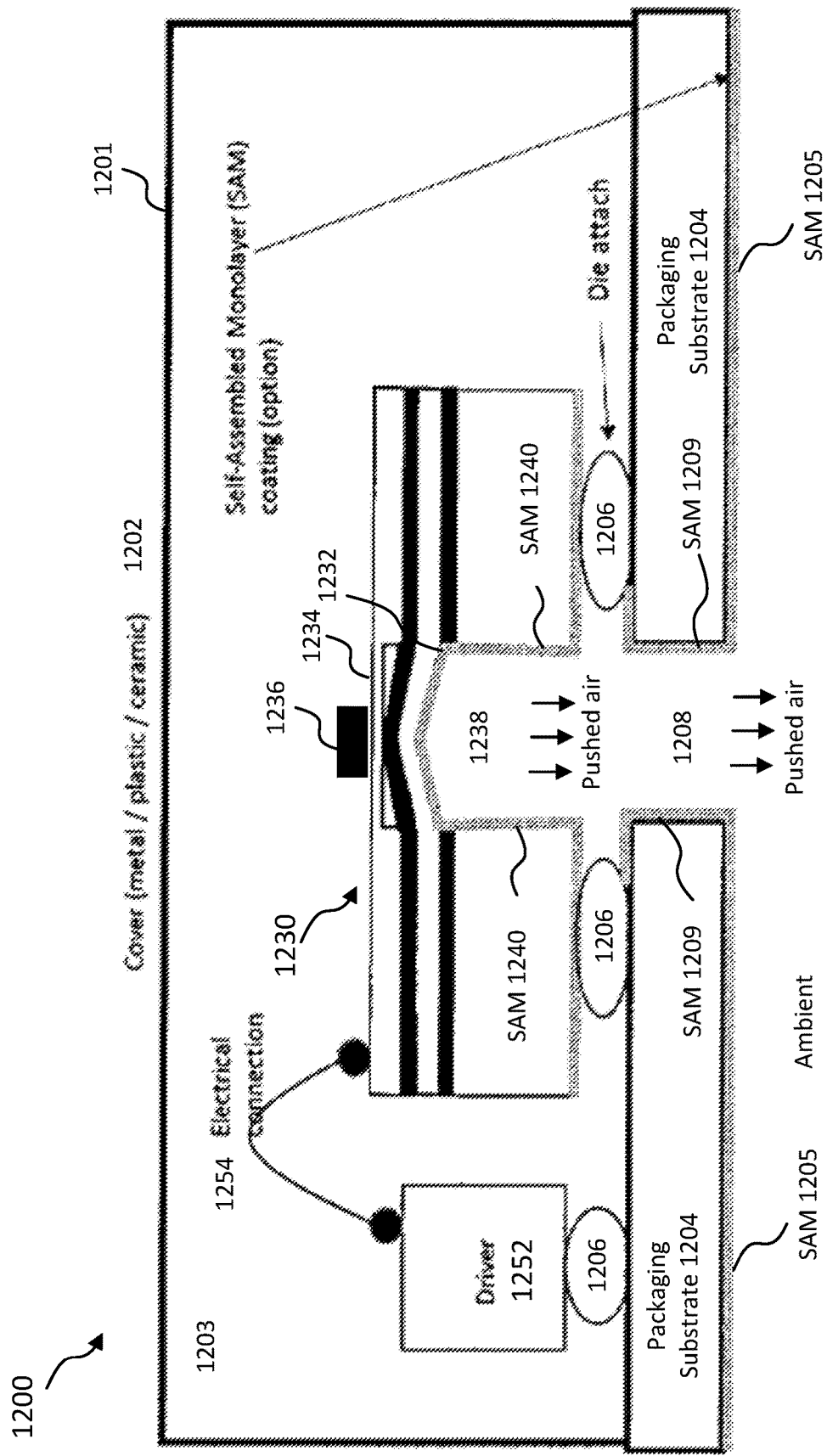
FIG. 12 is a side elevational view that shows a packaged speaker assembly according to an embodiment of the disclosure.

FIG. 12 shows a packaged acoustic transducer assembly 1200 according to an embodiment of the disclosure. The acoustic transducer assembly 1200 includes a housing 1201. The housing includes a cover 1202 and a packaging substrate 1203. The cover 1202 and the substrate 1203 define an internal cavity 1203 for hosting the single driver 1252 and the acoustic transducer 1230. The substrate 1203 includes an aperture opening 1208. In one embodiment, the internal cavity 1203 is fluidically connected to an ambient through the opening 1208. In another embodiment, the internal cavity 1203 is sealed-off from the ambient, except the portion of the internal cavity 1203 that overlaps with the second cavity 1238 that is fluidically connected to an ambient environment.

The driver device 1252 is secured on the packaging substrate 1203 through a die attachment means 1206, e.g., glue. The acoustic transducer 1230 is secured on the packaging substrate 1203 through a die attachment means 1206.

The driver device 1252 is an electrical signal generator that sends out the electrical signals representing the sounds to be generated. The driver device 1252 sends the electrical signal to the acoustic transducer 1230 through the electrical connection 1254.

The acoustic transducer 1230 includes an electro-mechanical transducer 1236. The electro-mechanical transducer 1236 is attached to a top surface of the first flexible structure 1234. The second flexible structure 1232 includes a upward curving arc contacting a bottom surface of the first flexible structure 1234. The electro-mechanical transducer 1236 produces vertical vibration when the electrical signal is applied to it.

The vertical vibration of the electro-mechanical transducer 1236 is transferred to the first flexible structure 1234 and then to the second flexible structure 1232. The vibration of the second flexible structure 1232 pushes the air away from it. The vibration of the second flexible structure 1232 pushes the air from the second cavity 1238 toward a bottom direction fluidically connected to the ambient. The opening 1208 overlaps with the second cavity 1238 in a vertical direction. The air being pushed away by the second flexible structure 1232 can be vented out to the ambient through the opening 1208.

SAM 1205 is coated on an exterior surface of the packaging substrate 1204. SAM 1209 is coated on an interior surface of the opening 1208. SAM 1240 is coated on an internal surface of the second cavity 1238, including side and top walls of the second cavity 1238.

In one embodiment, the die attachment means 1206 can seal around the second cavity 1238 as well as the opening 1208 creating an air pathway. This air pathway guides the pushed air from the second cavity 1238 through 1208, without allowing the sound wave to dissipate into the internal cavity 1203. In such configuration, the internal cavity 1203 is sealed-off from the second cavity 1238 and the ambient, except the portion of the internal cavity 1203 that overlaps with the second cavity 1238 that is fluidically connected to an ambient environment. This produces a better quality of sound.

The acoustic transducer assembly 1200 provides multiple advantages. The bent diaphragm structure of the second flexible structure 1232 allows the transducer (e.g., a MEMS speaker) to be miniaturized and achieve a high sensitivity due to a large movement of the bent diaphragm structure to push a large amount of air. Fabricating with a semiconductor process allows the speaker 1230 to be assembled in a surface mount device (SMD) which is of great advantage to end users. As in one embodiment, a user's ear is in contact with the exterior surface of the packaging substrate 1204, where coated with SAM 1205.

In addition, for different application scenarios, the acoustic transducer 1230 disclosed herein can be scaled down or up to satisfy different sensitivity requirements with a similar structure or fabrication process. In some applications, multiple speakers 1230 can be arranged in a form of an array. The array of acoustic transducer 1230 can produce a larger volume of sound. The acoustic transducer 1230 disclosed herein can be waterproof and used in outdoor environment.

Coupling of two diaphragms (the first flexible structure 1234 and the second flexible structure 1232) without bonding the two parts together avoids introduction of stresses, and can maintain a stable performance with temperature variations. A polysilicon film 850 can be employed as the second flexible structure 1232 to produce a wavy-shaped diaphragm which allows a longer movement distance with a lesser push force.

The fabrication of the structure and fabrication processes are based on well-established semiconductor fabrication technologies and therefore the speaker disclosed herein can be mass produced in a normal semiconductor wafer fabrication facility.

Embodiments of this disclosure include following aspects.

Aspect 1. An acoustic transducer, comprising: a first flexible structure having a top surface and a bottom surface; a transducer attached to the top surface of the first flexible structure, wherein the transducer causes deformation of the first flexible structure when an input electrical signal is applied to the transducer; and a second flexible structure having a convex top surface and a concave bottom surface, the convex top surface of the second flexible structure being in contact with the bottom surface of the first flexible structure; wherein deformation of the first flexible structure causes deformation of the second flexible structure.

Aspect 2. The acoustic transducer according to aspect 1, wherein the concave bottom surface of the second flexible structure is fluidically connected to an ambient environment.

Aspect 3. The acoustic transducer according to aspects 1-2, wherein the concave bottom surface of the second flexible structure pushes air away during deformation of the second flexible structure.

Aspect 4. The acoustic transducer according to aspects 1-3, wherein the second flexible structure comprises a first layer, the first layer including a first material, the first material having a first thermal expansion coefficient; a second layer, the second layer including a second material, the second material having a second thermal expansion coefficient; wherein the first thermal expansion coefficient and the second thermal expansion coefficient are different.

Aspect 5. The acoustic transducer according to aspects 1-4, wherein the first layer and the second layer are directly or indirectly bonded to each other.

Aspect 6. The acoustic transducer according to aspects 1-5, wherein the first flexible structure is a beam, a film, or a diaphragm.

Aspect 7. The acoustic transducer according to aspects 1-6, wherein the second flexible structure is a beam, a film, or a diaphragm.

Aspect 8. The acoustic transducer according to aspects 1-7, further comprising: a first substrate anchoring the first flexible structure; and a second substrate anchoring the second flexible structure, wherein the first substrate is directly or indirectly bonded to the second substrate.

Aspect 9. The acoustic transducer according to aspects 1-8, wherein the transducer is made with piezoelectric material.

Aspect 10. The acoustic transducer according to aspects 1-9, wherein the piezoelectric material vibrates when receiving the input electrical signal causing deformation of the first flexible structure.

Aspect 11. The acoustic transducer according to aspects 1-10, wherein the convex top surface of the second flexible structure includes a plurality of convex arcs and the concave bottom surface of the second flexible structure includes a plurality of concave arcs.

Aspect 12. A process to fabricate an acoustic transducer, comprising depositing a first layer on a first semiconductor substrate, the first layer including a dielectric material; depositing a second layer on top of the first layer, the second layer including a semiconductor material; depositing a third layer on top of the second layer, the third layer including a dielectric material; etching a first cavity out from a second semiconductor substrate; and bonding the second substrate with the third layer, wherein the bonding is performed such that a perimeter of the first cavity is defined by the second substrate and the third layer.

Aspect 13. The fabrication process of the acoustic transducer according to aspect 12, including grinding the second substrate to form a first flexible structure over the first cavity in a vertical direction.

Aspect 14. The fabrication process of the acoustic transducer according to aspects 12-13, including depositing a fourth layer on top of the second substrate, the fourth layer including a dielectric material.

Aspect 15. The fabrication process of the acoustic transducer according to aspects 12-14, including depositing a fifth layer on top of the fourth layer, the fifth layer including a metal material, the fifth layer covering the first cavity in a vertical direction.

Aspect 16. The fabrication process of the acoustic transducer according to aspects 12-15, including depositing a sixth layer on top of the fifth layer, the sixth layer including a piezoelectric material, the sixth layer being disposed over the first cavity in a vertical direction.

Aspect 17. The fabrication process of the acoustic transducer according to aspects 12-16, including depositing a seventh layer on top of the sixth layer, the seventh layer including a dielectric material, the seventh layer having an opening configured to expose, at least partially, a top surface of the sixth layer.

Aspect 18. The fabrication process of the acoustic transducer according to aspects 12-18, including depositing an eighth layer on top of the seventh layer, the eighth layer including a metal material, the eighth layer forming an electrical contact with the sixth layer through the opening of the seventh layer.

Aspect 19. The fabrication process of the acoustic transducer according to aspects 12-18, including etching a second cavity out of the first substrate, wherein the second cavity has a top end in contact with a bottom surface of the first dielectric layer, the second cavity is fluidically connected to an ambient environment.

Aspect 20. The fabrication process of the acoustic transducer according to aspects 12-19, including etching a portion of the first layer away, wherein the portion of the first layer being etched is in contact with the second cavity.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and acts described in the specification. As one of ordinary skill in the art will readily appreciate from the present invention, disclosure, machines, manufacture, compositions of matter, means, methods, or acts, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or acts.

What is claimed is:

1. An acoustic transducer, comprising:
   a first flexible structure having a flat top surface and a flat bottom surface;
   a transducer attached to the flat top surface of the first flexible structure, wherein the transducer causes deformation of the first flexible structure when an input electrical signal is applied to the transducer; and
   a second flexible structure having a convex top surface and a concave bottom surface, the convex top surface of the second flexible structure being in bonded contact with the flat bottom surface of the first flexible structure, the second flexible structure including:
      a first layer in bonded contact with the flat bottom surface of the first flexible structure, the first layer including a first material, the first material having a first thermal expansion coefficient; and
      a second layer, the second layer including a second material, the second material having a second thermal expansion coefficient, wherein the first thermal expansion coefficient is smaller than the second thermal expansion coefficient;
   wherein deformation of the first flexible structure causes deformation of the second flexible structure.

2. The acoustic transducer according to claim 1, wherein the concave bottom surface of the second flexible structure is fluidically connected to an ambient environment.

3. The acoustic transducer according to claim 1, wherein the concave bottom surface of the second flexible structure pushes air away during deformation of the second flexible structure.

4. The acoustic transducer according to claim 1, wherein the first layer and the second layer are directly or indirectly bonded to each other.

5. The acoustic transducer according to claim 1, wherein the first flexible structure is a beam, a film, or a diaphragm.

6. The acoustic transducer according to claim 1, wherein the second flexible structure is a beam, a film, or a diaphragm.

7. The acoustic transducer according to claim 1, further comprising:
   a first substrate anchoring the first flexible structure; and
      a second substrate anchoring the second flexible structure, wherein the first substrate is directly or indirectly bonded to the second substrate.

8. The acoustic transducer according to claim 1, wherein the transducer is made with piezoelectric material.

9. The acoustic transducer according to claim 8, wherein the piezoelectric material vibrates when receiving the input electrical signal causing deformation of the first flexible structure.

10. The acoustic transducer according to claim 1, wherein the convex top surface of the second flexible structure includes a plurality of convex arcs and the concave bottom surface of the second flexible structure includes a plurality of concave arcs.

11. An acoustic transducer, comprising:
a first flexible structure having a flat top surface and a flat bottom surface;
a transducer attached to the flat top surface of the first flexible structure, wherein the transducer causes deformation of the first flexible structure when an input electrical signal is applied to the transducer; and
a second flexible structure having a convex top surface and a concave bottom surface, the convex top surface of the second flexible structure being in non-bonded contact with the flat bottom surface of the first flexible structure, the second flexible structure including:
  a first layer in non-bonded contact with the flat bottom surface of the first flexible structure, the first layer including a first material, the first material having a first thermal expansion coefficient; and
  a second layer, the second layer including a second material, the second material having a second thermal expansion coefficient, wherein the first thermal expansion coefficient is smaller than the second thermal expansion coefficient;
wherein deformation of the first flexible structure causes deformation of the second flexible structure.

12. The acoustic transducer according to claim 11, wherein the concave bottom surface of the second flexible structure is fluidically connected to an ambient environment.

13. The acoustic transducer according to claim 11, wherein the concave bottom surface of the second flexible structure pushes air away during deformation of the second flexible structure.

14. The acoustic transducer according to claim 11, wherein the first layer and the second layer are directly or indirectly bonded to each other.

15. The acoustic transducer according to claim 11, further comprising:
  a first substrate anchoring the first flexible structure; and
  a second substrate anchoring the second flexible structure, wherein the first substrate is directly or indirectly bonded to the second substrate.

16. The acoustic transducer according to claim 11, wherein the convex top surface of the second flexible structure includes a plurality of convex arcs and the concave bottom surface of the second flexible structure includes a plurality of concave arcs.

* * * * *